United States Patent [19]

Muller

[11] 4,289,979
[45] Sep. 15, 1981

[54] TRANSISTORIZED MASTER SLAVE FLIP-FLOP HAVING THRESHOLD OFFSETS GENERATED BY CIRCUIT SIZE VARIATIONS

[75] Inventor: Harold Muller, Carlsbad, Calif.

[73] Assignee: Burroughs Corporation, Detroit, Mich.

[21] Appl. No.: 937,687

[22] Filed: Aug. 28, 1978

[51] Int. Cl.³ .......................................... H03K 3/289
[52] U.S. Cl. ............................... 307/272 A; 307/291; 307/299 A
[58] Field of Search ............... 307/272 A, 291, 299 A, 307/289

[56] References Cited

U.S. PATENT DOCUMENTS 3,617,776 11/1971 Priel .................................. 307/272 A
3,622,810 11/1971 Sasaki ............................. 307/272 A
3,728,560 4/1973 Treadway ....................... 307/272 A Primary Examiner—John Zazworsky
Attorney, Agent, or Firm—James E. Ledbetter; David G. Rasmussen; Kevin R. Peterson

[57] ABSTRACT

A transistorized master slave flip-flop having a threshold offset generated through circuit size variations. The area of the emitter regions of selected bipolar transistors in the master and slave flip-flops are varied to provide preferred sequencing and thereby avoid untimely changes in state. Adjusting the area of the emitter regions provides the necessary offset without increasing the number of components or circuit crossovers.

8 Claims, 2 Drawing Figures

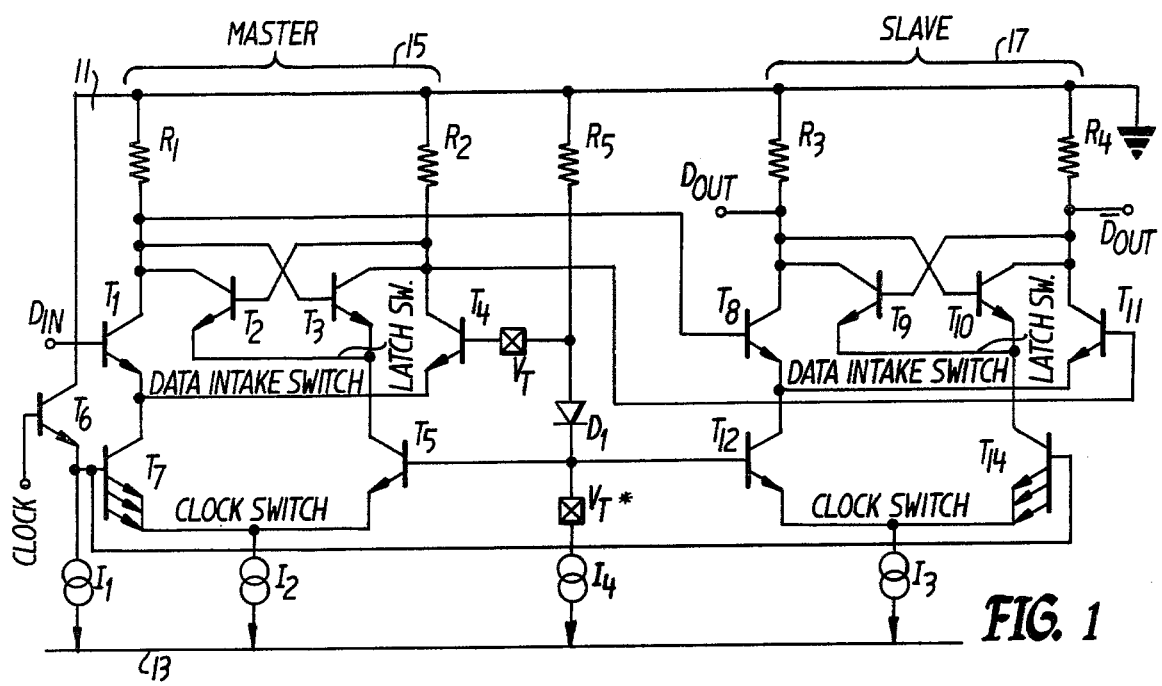
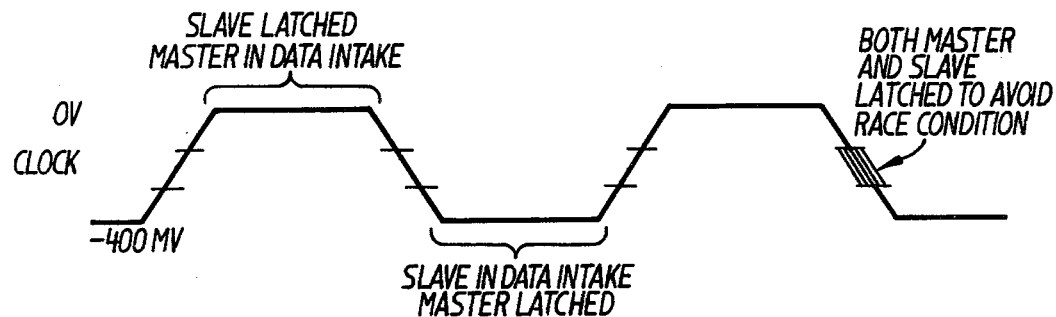
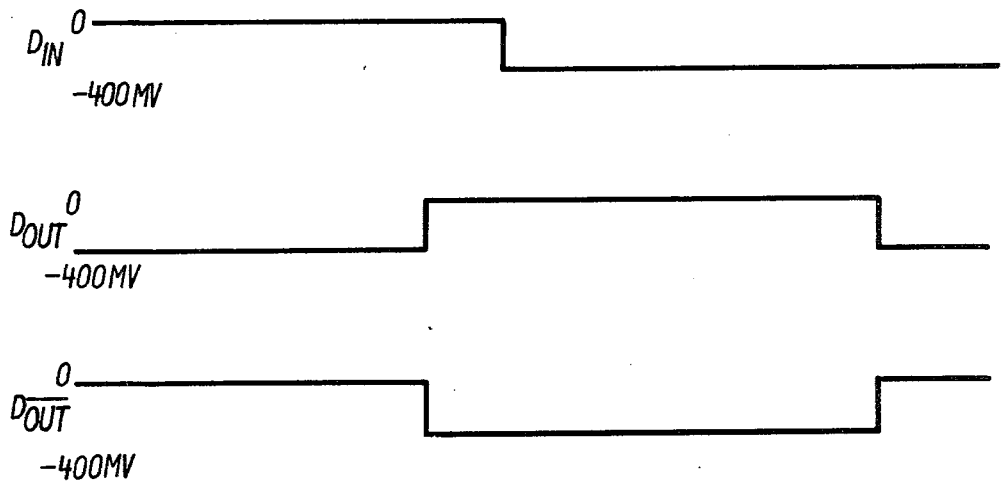
FIG. 1
FIG. 2

TRANSISTORIZED MASTER SLAVE FLIP-FLOP HAVING THRESHOLD OFFSETS GENERATED BY CIRCUIT SIZE VARIATIONS

FIELD OF THE INVENTION

The invention relates with particularity to the use of circuit size variations to inhibit untimely changes of state within logic circuits.

BACKGROUND OF THE INVENTION

In a transistorized master slave flip-flop circuit operated in the divide-by-two mode a first gate circuit which controls the master flip-flop is itself controlled both by clock signals and by the output of the slave flip-flop. A second gate circuit is provided to control the slave flip-flop and it is also controlled by the clock signals as well as by the output of the master flip-flop. Quite often these master slave flip-flop circuits are formed by integrated circuit techniques to decrease their size, increase their reliability and improve their performance.

Many of the prior art master slave flip-flops have encountered the problem that in the instance of a change of state of one flip-flop its associated voltage, which is applied through a gate circuit to the other flip-flop, is also changed and may result in an unstable state or incorrect state switching. It has been a common practice in prior art bipolar master slave flip-flops to provide a voltage offset within each flip-flop to create two different switching thresholds for the clock transistors in the flip-flops. One prior art technique has been to generate two distinct voltage levels which are routed through separate lines to one of the transistors in the master flip-flop and one of the transistors in the slave flip-flop. This creates separate switching levels for the gate circuits and by creating a preferred, stable state will inhibit any erroneous changes in the flip-flops caused by simultaneous switching of both, master and slave circuit elements. These different voltage thresholds are normally supplied by a voltage source external to the integrated circuit of the flip-flop but still within the monolithic implementation. It is apparent that such a method of inhibiting erroneous changes in state requires additional crossovers within the integrated circuit of the master slave flip-flop to route the voltages to the proper transistors and will thus increase the complexity of the circuit. It is also expensive and cumbersome to utilize an additional separate voltage source. There are obvious shortcomings in this prior art technique due to the increased complexity of the integrated circuit and the heat generated by the additional voltage source.

A second technique was developed in the prior art to establish a voltage offset between the bipolar transistors in the master slave flip-flop. This technique contemplated the use of additional resistors within the master slave flip-flop circuits to create the voltage offset. A resistor would be placed in one side of the current switch if it is the master flip-flop and with an additional resistor being placed in the other side of the current switch of the slave flip-flop to thereby generate with extra components the required offset. While this technique does not require any additional crossovers within the integrated circuit it does require the fabrication of additional circuit elements within each flip-flop circuit. The presence of the resistor slows down the operation of the current switch, increases the component count on the chip and further complicates the fabrication process.

A third prior art technique has been developed in master slave flip-flops which are fabricated from MOS transistors or other insulated-gate field-effect transistors. The required offset is provided by a suitable choice of the length-width ratio of the channels in the field effect transistors within the gate circuit to thereby provide the required load resistances. It is apparent, however, that this technique cannot be employed in master slave flip-flops which are fabricated from bipolar transistors.

SUMMARY OF THE INVENTION

It is an object of this invention to generate a threshold offset in a bipolar transistorized master slave flip-flop through the use of circuit size variations.

It is a further object of this invention to generate a threshold offset in a bipolar transistorized master slave flip-flop which reduces the component count and increases the circuit speed over prior art devices.

It is an additional object of this invention to provide a bipolar transistorized master slave flip-flop wherein a threshold offset is generated by varying the size of the emitters in selected bipolar transistors.

It is also an object of this invention to provide a bipolar transistorized master slave flip-flop wherein untimely changes of state resulting from variations in the properties of the circuit elements are avoided by generating a threshold offset through changes in the area of the emitters of selected bipolar transistors.

It is yet another object of this invention to provide a bipolar transistorized master slave flip-flop having a well defined switching sequence.

These and other objects are accomplished by a transistorized bipolar master slave flip-flop wherein a threshold offset is created within each flip-flop to inhibit erroneous sequencing. The master flip-flop has an emitter of increased area in the data intake branch of the flip-flop. The slave flip-flop has a bipolar transistor with an emitter of increased area in the data latch branch of the flip-flop. A two to one differential area between the emitters of the two bipolar transistors which are interconnected to form the flip-flops has been found to create a sufficient offset to inhibit erroneous sequencing. Generating the threshold offsets by varying the size of the emitters results in a faster flip-flop circuit which has a reduced number of circuit elements and a reduced number of crossovers.

BRIEF DESCRIPTION OF THE DRAWINGS

The novel features which are characteristic of this invention are set forth with particularity in the appended claims. The invention itself, however, both in its organization and method of operation, together with further objects and advantages thereof, may best be understood with reference to the following description when considered in conjunction with the accompanying drawings wherein:

FIG. 1 shows a circuit diagram of a transistorized bipolar master slave D-type flip-flop according to the invention.

FIG. 2 shows a timing diagram of a transistorized bipolar master slave D-type flip-flop according to the invention.

DETAILED DESCRIPTION OF THE PREFERRED EMBODIMENT

FIG. 1 exhibits a D-type flip-flop which employs circuit size variations to prevent erroneous and untimely switching. The circuit elements in FIG. 1 are interconnected between an upper circuit rail 11 which is maintained at a ground level and a lower circuit rail 13 which is held at sufficient negative potential, e.g. $-3.6$ to $-6.0$ volts. The transistors employed in the exhibited flip-flop are bipolar and elements I1, I2, I3 and I4 are designations of current sources. The clock signal for the flip-flop is entered at the base of transistor $T_6$. This clock signal is employed to switch on the multi-emitter transistors $T_7$ and $T_{14}$. In FIG. 1 the multi-emitter transistors are pictured as having three emitter leads which is intended to imply that the emitter size of the transistors $T_7$ and $T_{14}$ is approximately three times the size of the other transistors employed in the flip-flop. One skilled in the art will understand that the size of the emitter is varied according to the voltage offset which is desired for switching on selected transistors.

The master flip-flop generally indicated 15 is essentially a D-type latch as is the slave flip-flop 17. When coupled together the master and slave flip-flops function as an edge trigger, dual rank or master slave flip-flop. The master flip-flop and the slave flip-flop each employ a clock data intake switch and a latch switch and, as will hereinafter be explained, the circuit size variations employed in transistor $T_7$ and $T_{14}$ insure that the master and slave latches are maintained in opposite states. This is intended to mean that the master and slave flip-flops are never both in the data intake state but are rather maintained such that when the master flip-flop is in the data intake mode the slave flip-flop will be latched and vice versa. It is also possible during a certain portion of each clock period for both the master and slave flip-flops to be in the latch mode. Race conditions are avoided by the instant circuit insuring that the master flip-flop and the slave flip-flop will not coincidently be in the data intake mode.

The signal which triggers the changes in state within the D-type flip-flop is supplied as a signal to the base of transistor $T_1$. This signal is $D_{in}$. The collector of $T_1$ is coupled to the ground rail through load resistor $R_1$. The emitter of transistor $T_1$ is connected to the collector of multiple emitter transistor $T_7$. The emitter of $T_1$ is also coupled with the emitter of $T_4$ and as will hereinafter be explained this coupling forms the data intake switch for the master flip-flop. The latch switch for the master flip-flop is formed by transistors $T_2$ and $T_3$. The emitters of these transistors are coupled together to the collector of $T_5$. The collector of $T_2$ is coupled to the ground rail through resistor $R_1$ and its base is coupled to the ground rail through resistor $R_2$. Similarly the base of $T_3$ is coupled to the ground rail through load resistor $R_1$ and its collector is coupled to the ground rail through $R_2$. Transistor $T_4$ functions differentially with $T_1$ as will subsequently be described to form the data intake switch. The base of $T_4$ is held at a permanent DC bias of $-200$ millivolts. This value of $-200$ millivolts will be referred to as $V_T$. Finally, in explanation of the connections of the master flip-flop 15, the emitters of multiple emitter transistor $T_7$ are coupled through the current source $I_2$ to the negative supply rail 13. The emitter of $T_5$ is likewise coupled to the negative supply rail 13. The base of $T_5$ is maintained at a permanent DC bias equal to $-1.0$ volts. This bias is referred to as $V_{T^*}$. $V_{T^*}$ is equal to the sum of the $V_{BE}$ of D1 and the $-200$ millivolts of $V_T$. The value of $V_T$ and $V_{T^*}$ can be provided through resistor $R_5$, diode D1 and current source $I_4$.

The slave flip-flop also includes a data intake switch and a latch switch. It can be observed that the multi-emitter transistor of the slave flip-flop $T_{14}$ is coupled into the opposite leg of the circuit of the slave flip-flop 17 as is the multiple emitter transistor $T_7$ in the master flip-flop circuit 15. As will be subsequently explained this will insure that the master and slave flip-flops are maintained in opposite modes through the major portion of each clock cycle. In the slave flip-flop the base of transistor $T_8$ is coupled to the collector of transistor $T_1$. The emitter of $T_8$ forms the data intake switch by being coupled with the emitter of transistor $T_{11}$. The collector of transistor $T_8$ is coupled with $D_{out}$ and the ground rail through resistor $R_3$. The latch switch of the slave flip-flop is formed by transistors $T_9$ and $T_{10}$. The emitters of $T_9$ and $T_{10}$ are coupled together with the collector of multi-emitter transistor $T_{14}$. The base of $T_9$ is coupled to $\overline{D}_{out}$ which is coupled to the ground rail through $R_4$. The base of $T_{10}$ is coupled to the ground rail through $R_3$. Transistor $T_{11}$ has its collector coupled to $\overline{D}_{out}$ and is coupled also with the ground rail through resistor $R_4$. The base of transistor $T_{11}$ is coupled to the collector of transistor $T_4$. Transistor $T_{12}$ and the multi-emitter transistor $T_{14}$ comprise the clock switch for the slave flip-flop. The base of $T_{12}$ is coupled to the DC bias $V_{T^*}$. The emitter of transistor $T_{12}$ is coupled to the negative supply rail through the current source $I_3$. As was previously mentioned, the base of multi-emitter transistor $T_{14}$ is coupled to the emitter of the clock transistor $T_6$.

In order to more fully understand how the D-type flip-flop of FIG. 1 functions it should be interpreted with the timing diagrams of FIG. 2. The first timing diagram is the input to the base of the clock transistor $T_6$. The clock signal has a voltage swing between a low of $-400$ millivolts and a high of 0 volts. The first intermediate level indicated in the clock signal is equal to a $-230$ millivolts and the second intermediate level is a $-170$ millivolts. As indicated in the timing diagram of the clock signal the master flip-flop is maintained in data intake mode and the slave flip-flop is maintained in the latch mode during the interval between the clock signal attaining $-170$ millivolts or the second intermediate level on the rise of the waveform and until it falls below a $-170$ millivolts on the fall of the clock signal. Similarly, the slave flip-flop is maintained in data intake mode and the master flip-flop is latched during that portion of the clock signal when its value is $-230$ millivolts or below. The portion of the clock signal between the first intermediate level of $-230$ millivolts and the second intermediate level of $-170$ millivolts finds the master and slave flip-flops both latched to avoid race conditions in the circuit.

The second waveform in FIG. 2 is $D_{in}$ which is supplied to the base of transistor $T_1$. This waveform is a square wave with a voltage swing between $-400$ millivolts and 0 volts. The outputs of the D-type flip-flop are shown as $D_{out}$ and $\overline{D}_{out}$ and are, of course, complements of each other. Their voltage swing is also between $-400$ millivolts and 0 volts.

In describing how the D-type master slave flip-flop of FIG. 1 operates it is important to recognize that the master flip-flop and slave flip-flops are implemented in such a manner that they each function as a D-type latch. The master latch and the slave latch when combined in the circuit of FIG. 1 function as an edge triggered dual rank or master slave flip-flop. The function of one of the latches is such that if the clock is activating the data intake switch of the latch then whatever logic level is present at the input $D_{in}$ will be copied through to the output. If the clock is activating the latch switch, then the input of the latch is completely disconnected from the output and the output will carry the signal that was previously latched up within the latch.

The above-described switching is accomplished through the clock switch which, in the case of the master latch or flip-flop, steers current either through the multi-emitter transistor $T_7$ or the transistor $T_5$. If the current flow is through $T_7$ the data intake switch will be activated and if the current flow is through $T_5$ the latch function of the master latch will be implemented. In order to steer current in the clock switch of the master latch through either transistor $T_7$ or transistor $T_5$ the clock input of transistor $T_6$ is moved up or down by virtue of the clock signal. The input from the clock moves from a low of $-400$ millivolts to a high of 0 volts thus causing the emitter of transistor $T_6$ and also the base of transistor $T_7$ to move from $-800$ millivolts to $-1.2$ volts. This is in essence a $\pm 200$ millivolt swing about $-1.0$ volts which drives the differential amplifier formed from the transistors $T_5$ and $T_7$. One input of the differential amplifier is biased by $V_{T^*}$ at $-1.0$ volts and the base of $T_7$ is switched from $-800$ millivolts to $-1.2$ volts. This steers the current through either transistor $T_5$ to latch the master flip-flop or through transistor $T_7$ to place the master flip-flop in data intake mode. If the input to the base of transistor $T_7$ is at a $-800$ millivolts current will flow through the transistor $T_7$, if the input to the base of transistor $T_7$ is at a $-1.2$ volts current will flow through the transistor $T_5$. This is how the master flip-flop is switched between the data intake mode and the latch mode.

If the master flip-flop is in data intake mode, i.e. current is flowing from the collector of transistor $T_7$ it will be subject to another differential amplifier. This differential amplifier is formed from the emitter coupled switch of transistors $T_1$ and $T_4$. The base of the transistor $T_4$ is maintained at a constant DC threshold of $-200$ millivolts while the base to transistor $T_1$ is maintained at either 0 volts or $-400$ millivolts depending upon the logic state of $D_{in}$. If the base of transistor $T_1$ is maintained at 0 volts, current will flow through transistor $T_1$, and if the base is maintained at $-400$ millivolts the current will flow through transistor $T_4$. When the master flip-flop is in data intake mode the value of $D_{in}$ will be directly copied over the load resistor $R_2$ which runs between the ground rail and the collectors of transistor $T_3$ and $T_4$. This is the in-phase output of the master latch. The out-of-phase output of the master latch is provided at the collector tie of transistors $T_1$ and $T_2$.

If the clock input to transistor $T_6$ is in the $-400$ millivolt state then the switch current of the master latch will flow through current source $I_2$, the emitter of $T_5$ and out the collector of $T_5$. This current will flow to the emitter coupled switch which is labeled latch switch and depending upon the regenerative feedback connections created between the collector and base nodes of $T_2$ and $T_3$ will maintain the previous state for the master latch. In essence there is no current flowing through the data intake switch since all the current is flowing through the latch switch of transistors $T_2$ and $T_3$. Any change in $D_{in}$ supplied to the base of transistor $T_1$ will not affect the collector nodes of $T_2$ and $T_3$ because $T_1$ is not switching any current. This in essence decouples the output of the master latch from the input and the information existing in the master latch will be retained.

If the same operational analysis is applied to the slave flip-flop or latch it can be seen that since the multi-emitter transistor $T_{14}$ is coupled to the latch switch and the DC biased transistor $T_{12}$ is coupled to the data intake switch formed by transistors $T_8$ and $T_{11}$ that the slave flip-flop will be in data intake during those clock intervals when the input to $T_6$ is between $-400$ millivolts and approximately $-230$ millivolts. It is during the same time period that the master latch will be in a latch mode. Similarly, the slave latch will be in a latch state in those periods when the clock signal is between $-170$ millivolts and 0 volts. Because of the differential switching between the transistors $T_7$ and $T_5$ and transistors $T_{12}$ and $T_{14}$ and considering the $-1.0$ volt bias of the $V_{T^*}$ both the master and slave latches will be in a latch state for that part of the clock signal between $-230$ millivolts and $-170$ millivolts. Permitting both the master and slave flip-flops to be in the latch mode simultaneously during this transition period successfully avoids any race condition and erroneous changes in state for the D-type flip-flop formed by the combination of master and slave latches.

The above-described system for accomplishing switching the master and slave latches in an out-of-phase manner is accomplished without the requirement of inserting a resistor in opposite legs of the clock switches of the master and slave flip-flops or by employing a voltage source to produce an offset for the transistors $T_7$ and $T_{14}$ in the clock switches of the master and slave flip-flops. The generation of a threshold offset within the master and slave flip-flops is accomplished by using circuit size variations in the form of enlarged emitters in opposite bipolar transistors of the clock switches of the master and slave flip-flops. No additional circuit interconnection or crossovers are required by the disclosed apparatus. By tripling the size of the emitters of the transistors $T_7$ and $T_{14}$ an approximate offset of 60 millivolts is generated. This 60 millivolts comprises the $V_{BE}$ drop of transistor $T_5$ which is approximately 30 millivolts greater than transistor $T_7$ and the $V_{BE}$ drop of transistor $T_{12}$ which is approximately 30 millivolts greater than the $V_{BE}$ drop of transistor $T_{14}$. This is assuming that the switch current from the current sources $I_2$ and $I_3$ are held constant. The generation of this voltage offset through circuit size variations has the advantage of speeding up the operation of the D-type flip-flop by employing switching devices which have a lower $V_{BE}$ drop than would result in the case of insertion of resistors in the legs of the clock switches.

The foregoing description of a D-type flip-flop which employs circuit size variations to generate switching differentials to avoid erroneous changes in state is intended to be explanatory of a preferred embodiment for implementing the instant invention. One skilled in the art would understand that this technique of employing circuit size variations in the form of enlarged emitters can be readily adapted to digital devices other than the disclosed D-type flip-flop. The scope of the invention is defined by the following claims.

What is claimed is

1. A master slave flip-flop circuit comprising:
input signal source means;
a master flip-flop coupled to said input signal source means and having a data intake circuit for passing the input source signal to the output of said master flip-flop and a latch circuit for preventing the input source signal from being passed through the output of said master flip-flop;

a slave flip-flop coupled to said master flip-flop and to said input signal source means, said slave flip-flop having a data intake circuit for passing the signal of said input signal source means to the output of said slave flip-flop and a latch circuit for preventing the signal from said input signal source means from being passed to the output said slave flip-flop; and means for actuating the data intake circuit and the latch circuit of said master flip-flop and the data intake circuit and the latch circuit of said slave flip-flop such that the data intake circuit of said master flip-flop and the data intake circuit of said slave flip-flop are never simultaneously actuated;

said means for actuating the data intake circuit and the latch circuit of the master flip-flop comprising: a source of clock signals; a first current source; a first multi-emitter bipolar transistor having its base coupled to said source of clock signals, its emitters coupled to said first current source and its collector coupled to said data intake circuit of said master flip-flop; a DC voltage source having a constant output intermediate the voltage range of said clock signals; and a first bipolar transistor having its base coupled to said DC voltage source, its collector coupled to said latch circuit of said master flip-flop and its emitter coupled to said first current source whereby current from said current source is steered by said first bipolar transistor to said latch circuit of said master flip-flop when the level of said clock signal is less than said voltage level of said first DC voltage source and where said current from said first current source is steered through said first multi-emitter transistor to said data intake circuit of said master flip-flop when said voltage level of said clock signal is greater than said voltage level of said constant DC voltage source;

said means for actuating the data intake circuit and the latch circuit of said slave flip-flop comprising: a second current source; a second multi-emitter bipolar transistor having its base coupled to said source of clock signals, its collector coupled to said latch circuit and its emitters coupled to said second current source; and a second bipolar transistor having its base coupled to said DC voltage source, its collector coupled to said data intake circuit of said slave flip-flop and its emitter coupled to said second current source.

2. A master slave flip-flop circuit for actuating an output signal means in response to an input signal comprising:

a source of clock signals;

an input signal source;

a master flip-flop for coupling said input signal to said output signal means;

a slave flip-flop for coupling said input signal to said output signal means;

current steering means for actuating said master flip-flop to couple said input signal to said output signal means during a first portion of each of said clock signals and for preventing the coupling of said input signal to said output signal means through said master flip-flop during a second portion of each of said clock signals and for actuating said slave flip-flop to couple said input signal to said output signal means during each of said second portions of said clock signals and for preventing said slave flip-flop from coupling said input signal to said output signal means during each of said first portions of said clock signals; wherein said current steering means steers current from said first current source through said data intake circuit of said master flip-flop during said first portion of said clock signals and steers the current from said first current source through said latch circuit of said master flip-flop during said second and third portions of said clock signals.

3. The master slave flip-flop of claim 2 wherein said current steering means prevents both master flip-flop and said slave flip-flop from coupling said input signal to said output signal means during a third portion of each of said clock signals.

4. The master slave flip-flop of claim 3 wherein said master flip-flop comprises a data intake circuit and a latch circuit and said slave flip-flop comprises a data intake circuit and a latch circuit.

5. A master slave flip-flop of claim 4 further including a first current source associated with said master flip-flop and a second current source associated with said slave flip-flop.

6. The master slave flip-flop of claim 5 wherein said current steering means steers current through the data intake circuit of said slave flip-flop during said second portion of said clock signal and steers said current from said second current source through said latch circuit of said slave flip-flop during said first and third portions of said clock signal.

7. The master slave flip-flop of claim 6 wherein said current steering means comprises:

a first multi-emitter transistor having its base coupled to said source of clock signals, its emitters coupled to said first current source and its collector coupled to said data intake circuit of said master flip-flop;

a first bipolar transistor having its base coupled to said constant DC voltage source, its collector coupled to said latch circuit of said master flip-flop and its emitter coupled to said first current source;

a second multi-emitter transistor having its base coupled to said source of clock signals, its collector coupled to the latch circuit of said slave flip-flop and its emitters coupled to said second current source; and a second bipolar transistor having its base coupled to said constant DC voltage source, its collector coupled to said data intake circuit of said slave flip-flop and its emitter coupled to said second current source.

8. A circuit for inhibiting erroneous changes of state in a master slave flip-flop comprising:

a source of clock signals;

a source of input signals;

a master flip-flop having a data intake circuit and a latch circuit;

means comprising a first current source, a first multi-emitter bipolar transistor having its base coupled to said source of clock signals, its emitters coupled to said first current source and its collector coupled to said data intake circuit of said master flip-flop; a DC voltage source having a constant output intermediate the voltage range of said clock signals; and a first bipolar transistor having its base coupled to said DC voltage source, its collector coupled to said latch circuit of said master flip-flop and its emitter coupled to said first current source, for generating a switching voltage differential in said master flip-flop such that said data intake circuit of said master flip-flop is actuated only during a first portion of each of said clock signals and said latch circuit of said master flip-flop is actuated only during a second portion and a third portion of each of said clock signals;

a slave flip-flop having a data intake circuit and a latch circuit;

means comprising a second current source, a second multi-emitter bipolar transistor having its base coupled to said source of clock signals, its collector coupled to said latch circuit of said slave flip-flop and its emitters coupled to second current source, a second bipolar transistor having its base coupled to said DC voltage source, its collector coupled to said data intake circuit of said slave flip-flop and its emitter coupled to said second current source for actuating said data intake circuit of said slave flip-flop only during said second portion of each of said clock signals and for actuating said latch circuit of said slave flip-flop only during said first portion and said third portion of each of said clock signals whereby the data intake circuit of said master flip-flop and the data intake circuit of said slave flip-flop are inhibited from being simultaneously actuated.

* * * * *